United States Patent
Sandhu et al.

(10) Patent No.: US 7,763,327 B2
(45) Date of Patent: Jul. 27, 2010

(54) METHODS USING OZONE FOR CVD DEPOSITED FILMS

(75) Inventors: Gurtej S. Sandhu, Boise, ID (US); Ravi Iyer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1135 days.

(21) Appl. No.: 11/192,326

(22) Filed: Jul. 27, 2005

(65) Prior Publication Data

US 2006/0029736 A1   Feb. 9, 2006

Related U.S. Application Data

(63) Continuation of application No. 08/636,069, filed on Apr. 22, 1996, now abandoned.

(51) Int. Cl.
*B05D 3/06* (2006.01)
(52) U.S. Cl. .................. 427/553; 427/558; 427/583; 427/588
(58) Field of Classification Search .............. 427/553, 427/558, 582, 583, 586, 588
See application file for complete search history.

(56) References Cited

U.S. PATENT DOCUMENTS

| | | | |
|---|---|---|---|
| 3,866,083 A | | 2/1975 | Datta et al. |
| 4,371,587 A | * | 2/1983 | Peters ........................ 428/446 |
| 4,579,750 A | | 4/1986 | Bowen et al. |
| 4,581,248 A | | 4/1986 | Roche |
| 4,694,777 A | | 9/1987 | Roche |
| 4,782,787 A | | 11/1988 | Roche |
| 4,910,043 A | | 3/1990 | Freeman et al. |
| 4,916,091 A | | 4/1990 | Freeman et al. |
| 5,000,113 A | | 3/1991 | Wang et al. |
| 5,112,647 A | | 5/1992 | Takabayashi |
| 5,166,101 A | | 11/1992 | Lee et al. |
| 5,192,589 A | | 3/1993 | Sandhu |
| 5,215,787 A | * | 6/1993 | Homma ................... 427/248.1 |
| 5,246,881 A | | 9/1993 | Sandhu et al. |
| 5,248,636 A | | 9/1993 | Davis et al. |
| 5,252,518 A | | 10/1993 | Sandhu et al. |
| 5,318,857 A | * | 6/1994 | Haluska ..................... 428/552 |
| 5,393,564 A | | 2/1995 | Westmoreland et al. |
| 5,399,379 A | | 3/1995 | Sandhu |
| 5,420,075 A | * | 5/1995 | Homma et al. .............. 438/624 |
| 5,605,867 A | | 2/1997 | Sato et al. |
| 5,633,211 A | | 5/1997 | Imai et al. |
| 5,661,092 A | * | 8/1997 | Koberstein et al. .......... 427/515 |
| 5,710,079 A | * | 1/1998 | Sukharev ................... 438/778 |
| 5,820,942 A | * | 10/1998 | Singh et al. ................. 427/508 |
| 5,962,079 A | * | 10/1999 | Koberstein et al. .......... 427/508 |
| 6,573,199 B2 | * | 6/2003 | Sandhu et al. .............. 438/798 |
| 6,649,218 B2 | * | 11/2003 | Qian ..................... 427/255.31 |
| 6,764,956 B2 | * | 7/2004 | Sandhu et al. .............. 438/715 |
| 6,793,736 B2 | * | 9/2004 | Sandhu et al. ................. 134/1 |
| 2004/0063898 A1 | | 4/2004 | Nishinaka et al. |
| 2004/0074338 A1 | | 4/2004 | Kuhn et al. |
| 2004/0113227 A1 | | 6/2004 | Goto et al. |

FOREIGN PATENT DOCUMENTS

| | | |
|---|---|---|
| EP | 0562625 | 3/1993 |
| JP | 62-077474 | 4/1987 |
| JP | 1-296627 | * 11/1989 |
| JP | 2-050966 | 2/1990 |
| JP | 02-050966 | 2/1990 |
| JP | 4-188622 | 7/1992 |
| JP | 05-186875 | 7/1993 |
| JP | 06-104181 | 4/1994 |

OTHER PUBLICATIONS

Tate, A., et al., "Theoretical and Experimental Investigations on the Deposition Rate and Processes of Parallel Incident Laser-Induced CVD". Appl. Phys. A 38, pp. 221-226 (1985).*

Nara, Yasuo, et al., "Synchrotron Radiation-Assisted Silicon Film Growth by Irradiation Parallel to the Substrate". Jpn. J. Appl. Phys, vol. 31 (1992) pp. 2333-2337.*

Tsai, Hung-Sheng, et al., CO2-Laser Assisted Plasma-Enhanced Chemical Vapor Deposition of Silicon Dioxide Thin Film. Jpn. J. Appl. Phys, vol. 40 (2001) pp. 3093-3095. Part 1, No. 5A.*

Sakai, Shigeki, et al., "Large-area pulsed-laser deposition of dielectric and ferroelectric thin films". J. Vac. Sci. Technol. A 25(4), Jul./Aug. 2007, pp. 903-907.*

(Continued)

*Primary Examiner*—Bret Chen
(74) *Attorney, Agent, or Firm*—Schwegman, Lundberg & Woessner, P.A.

(57) ABSTRACT

A CVD ozone ($O_3$) deposition process, with the preferred embodiment comprising the steps of disposing a substrate in a chemical vapor deposition chamber and exposing the substrate surface to a $SiO_2$ precursor gas, a carrier gas, and optionally a dopant gas in the presence of ozone and exposing the reaction volume of the 5 gases above the substrate surface to a high intensity light source, to increase the functional atomic oxygen concentration and reduce the fixed charge in the deposited films.

30 Claims, No Drawings

OTHER PUBLICATIONS

Atkins, Peter, et al., "In: Chemical Principles—The Quest for Insight", *W. H. Freeman and Co.*: New York, (1999),616-620.

Harrison, P., "In: Dictionary of Physics", *Cassell Academic*, London, Definition of "diffract" and "diffraction",(1998),44-45.

Inoue, K., et al., "Growth of SiO2 Thin Film by Double-excitation Photoinduced Chemical Vapor Deposition Incorporated with Microwave Excitation of Oxygen", *J. Appl. Phys.*, 64, (Dec. 1, 1988),6496-6501.

Ohring, M., "In: The Materials Science of Thin Films", *Academic Press, Inc.*, San Diego, (1992),52-53.

Pierson, H. O., "In: Handbook of Chemical Vapor Deposition (CVD)", *Noyes Publications*, Park Ridge, NJ, (1992),26-27.

* cited by examiner

METHODS USING OZONE FOR CVD DEPOSITED FILMS

This application is a Continuation of U.S. application Ser. No. 08/636,069, filed Apr. 22, 1996, abandoned, which is incorporated herein by reference.

TECHNICAL FIELD

This invention relates to integrated circuit manufacturing processes and, more specifically, to a novel process using ozone for the chemical vapor deposition of doped and undoped $SiO_2$ films.

BACKGROUND

In order to build an integrated circuit, many active devices need to be fabricated on a single substrate. The current practice in semiconductor manufacturing is to use thin film fabrication techniques. A large variety of materials can be deposited using thin films, including metals, semiconductors, insulators and the like. The composition and uniformity of these thin layers must be strictly controlled to facilitate etching of submicron features. The surface of the substrate, most often a wafer, must be planarized in some way to prevent the surface topography from becoming increasingly rough with each added thin film level. The formation of such films is accomplished by a large variety of techniques.

Chemical vapor deposition (CVD) processes are often selected over competing deposition techniques because they offer numerous advantages, including the ability of CVD to deposit films from a wide variety of chemical compositions.

In general a CVD process includes the following steps: a selected composition and flow rate of reactant and inert gases are dispatched into a reaction chamber; the gases move to the substrate surface; the reactants are adsorbed on the substrate surface; the species undergo a film-forming chemical reaction and the by-products of the reaction are desorbed from the surface and conveyed away from the surface.

The semiconductor industry's continuing drive towards tighter device geometries, has placed an increased demand for cost-effective solutions for the problem of planarization. TEOS-based oxides (tetraethylorthosilicate) have attracted the industry's attention for several years due to the superior film quality they offer over traditional silane-based CVD technologies. The TEOS/$O_3$ processes operating at atmospheric pressures possess markedly superior step coverage and planarization characteristics. The unique high mobility of the low temperature TEOS chemistry provides excellent planarization for sub-half micron geometries. As a result there has been an increased use of TEOS/ozone chemistry. The TEOS is used as a source of silicon to deposit silicon dioxide ($SiO_2$).

TEOS/$O_3$ is almost always deposited via atmospheric pressure chemical vapor deposition (APCVD) or nearly atmospheric pressures, using sub atmospheric chemical vapor deposition (SACVD). TEOS/ozone APCVD possesses a number of desirable characteristics, including: it is capable of sub-half micron void-free gap filling with good planarization, it offers a low deposition temperature, high moisture resistance, low stress, high breakdown voltage, low leakage current and low particle densities.

A TEOS molecule is fairly large and complex, has a low sticking coefficient and yields better step coverage than other silicon sources. It is found that a TEOS molecule can actually move over several microns before it finally settles down to react with the other species. Less reactive ozone ($O_3$), in TEOS/$O_3$ applications, allows even more surface mobility, by permitting the TEOS molecule to move over even longer distances before it reacts.

Other benefits of TEOS/ozone include: flow-like, as-deposited step coverage, lower reflow temperatures with excellent stability, and lower particle counts.

Although ozone based TEOS processes for undoped and doped $SiO_2$ films have been developed for high aspect ratio gapfill applications. One of the major issues facing integration of these films into standard process flows in semiconductor fabrication has to do with large shifts in high frequency capacitance voltage (C-V) flat band voltage due to fixed charge in the films.

The fixed charge is located in the so-called transition region between silicon (Si) and $SiO_2$. These charges are named fixed charges because they do not change their charge state by exchange of mobile carriers with the silicon, as with the interface trap charge. The fixed charge is considered to be a sheet of charge at the Si/$SiO_2$ interface.

The value of the fixed charge is determined by measuring the voltage shift of a high frequency capacitance-voltage (C-V) curve of a MOS capacitor test device. For the case of fixed charge at the interface, the flat-band voltage, of the C-V curve is related to the oxide charge, oxide thickness, and work function difference between the gate electrode and the silicon.

The value of the fixed charge depends on the oxidizing ambient, oxidizing temperature, silicon orientation, cooling rate from elevated temperature, cooling ambient, and subsequent anneal cycles. Although, it is desirable to minimize the value of the fixed charge, current semiconductor manufacturing technologies use ion implantation to control the device threshold voltage, which is the device parameter most impacted by the fixed charge. In spite of the ability to override small variations in the fixed charge, a goal of maintaining a low and reproducible value of the fixed charge is nevertheless still desirable during fabrication.

Fixed charge has generally been related to the presence of residual carbon in the films. It is believed that at higher pressures, due to high molecular collision frequency and increased recombination reactions, the number of oxygen atoms available for reaction is lower than at lower pressures. Any increase in $O_3$ flow/concentration is met by lower life time of the $O_3$ molecule leading to the saturation of atomic concentration of oxygen in the reaction chamber.

For lower pressure processes it has been shown that increasing the process temperature helps lower the fixed charge but this remedy is not totally effective for low pressure processes, such as TEOS/$O_3$ APCVD.

What is still needed is a thin film fabrication process that reduces the fixed charge value in the deposited film.

SUMMARY OF THE INVENTION

It is an object of the present invention to provide a CVD method with improved reduction of the fixed charge value in the deposited film.

It is another object of the present invention to provide a CVD method that provides a functional increase in amount of atomic oxygen available for reaction at the substrate surface.

The present invention is a process comprising the steps of disposing a substrate in a chemical vapor deposition chamber at atmospheric pressure and exposing the substrate surface to a $SiO_2$ precursor gas, a carrier gas, and optionally a dopant gas in the presence of ozone and exposing the reaction volume of the gases above the substrate surface to a high intensity light source, to reduce the fixed charge in the deposited films.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENT

It is an object of embodiments of the present invention to provide a CVD method with improved reduction of the fixed charge value in the deposited film.

It is another object of embodiments of the present invention to provide a CVD method that provides a functional increase in amount of atomic oxygen available for reaction at the substrate surface.

Embodiments of the present invention include a process comprising the steps of disposing a substrate in a chemical vapor deposition chamber at atmospheric pressure and exposing the substrate surface to a $SiO_2$ precursor gas, a carrier gas, and optionally a dopant gas in the presence of ozone and exposing the reaction volume of the gases above the substrate surface to a high intensity light source, to reduce the fixed charge in the deposited films.

APCVD ozone ($O_3$) deposition of doped and undoped $SiO_2$ films is carried out in accordance with the present invention in a high temperature, atmospheric pressure, cold wall chemical vapor deposition reactor. In general, the process comprises the steps of disposing a substrate in a chemical vapor deposition chamber and exposing the substrate surface to a $SiO_2$ precursor gas, a carrier gas, and optionally a dopant gas in the presence of ozone and exposing the reaction volume of the gases above the substrate surface to a high intensity light source, to increase the functional atomic oxygen concentration and reduce the fixed charge in the deposited films.

As an example, the deposition of a $SiO_2$ film doped with borophosphosilicate glass (BPSG), using TEOS/$O_3$, will be described in detail. Other examples of doped $SiO_2$ films that can be deposited with this process include fluorosilicate glass (FSG) and FBPSG, both of which would then use FTES (fluorotriethoxysilane) as the $SiO_2$ precursor. A silicon wafer is placed in the vacuum chamber of a cold wall CVD reactor. The separate gases are then fed into the CVD reactor. Helium or other gases can be used as a carrier gas and to regulate the uniformity of the film on the wafer surface. Helium is used as the carrier gas for TEOS and, in the case of the BPSG film, helium is also used as the carrier gas for the dopant sources. An ozonator is used to generate $O_3$ from an $O_2$ stream and the ozone concentration is kept at between 5 and 15 wt/%. The reaction volume of the gases, at or close to the wafer or substrate surface is exposed to a source of light supplied to furnish uniform illumination of the reaction volume. The source of light should be of a high intensity nature and can be supplied by any appropriate source, preferably in the present example, an array of mercury arc vapor lamps positioned to uniformly illuminate the reaction surface of the substrate.

The carrier gas is selected from the group consisting of the noble gases, nitrogen and hydrogen. The preferred carrier gas is a noble gas, with the most preferred gas being helium.

Turning to the $SiO_2$ precursor, the preferred $SiO_2$ precursor is TEOS, but other appropriate precursors may also be used. Examples of other $SiO_2$ precursors that can be used with the CVD ozone process of this invention include TMCTS (tetramethylcyclotetrasiloxane), DES (diethylsilane), DTBS (di-tertiarybutylsilane), and TMOS (tetramethylorthosilicate).

The preferred source for phosphorous for the BPSG dopant is TEPo, but other appropriate precursors may also be used. Examples of other phosphorous precursors that can be used with the CVD ozone process of this invention include TEPi (triethylphosphite), TMPo (trimethylphosphate), and TMPi (trimethylphosphite).

With regards to the boron source for the BPSG dopant, TEB (triethylborate) is preferred, but other appropriate precursors may also be used. Examples of other boron precursors that can be used with the CVD ozone process of this invention include triisopropylborate and TMB (trimethylborate).

The TEOS, TMPo and TEB are delivered to a dispersion head in the chamber using nitrogen bubblers. Bubbling nitrogen through TEOS, TMPo, and TEB forms a gas, which is then combined with ozone just before injection into the dispersion head. The reactants are combined with ozone immediately prior to injection into the dispersion head, this generally helps to ensure formation of highly mobile polysiloxane oligomers necessary for an in-situ flow shape and good dielectric properties.

Other alternatives in place of a bubbler apparatus for supplying the $SiO_2$ and dopant sources are known in the art and may be used; for example heated vapor controlled by a vapor mass flow controller, flash evaporation and direct injection into a mixing chamber.

The selected pressure is 1.0 torr to 760 torr, with 200 Torr being the most preferred. Such conditions are commonly referred to as APCVD.

Representative process conditions are as follows:

Temperature: 200° C. to 700° C., with 480° C. being deemed optimum for integrated circuit manufacture;

Pressure: 200 Torr;

Helium: 2,000 to 8,000 sccm (standard cubic centimeters per minute)

Ozone: 2,000-5,000 sccm;

Ozone: volume % of 5-15%

TEOS: 300-700 mgm

TEB: 100-300 mgm

TEPo: 35-75 mgm.

The reaction volume of the gases that is exposed to optical excitation in this process is meant to describe the volume of gas located within a chemically reactive distance of the substrate. The gas volume located in this vicinity is sometimes described in terms of the type of chemical reaction it tends to undergo. The reactant gases in the reaction volume are referred to as taking part in heterogeneous chemical reactions, rather than homogeneous reactions that take place in the gas volume in the rest of the chamber.

The high intensity light energy source needs to be applied only to the reaction volume and can be supplied by an array of lamps arranged to give uniform illumination of the said volume. It is not necessary to illuminate the gas volume in the rest of the CVD chamber or to illuminate the substrate surface. This process is different from photon-assisted CVD, where it is the substrate reaction surface on which photons are directed to increase reaction rates.

It is believed that optical excitation provided by the high flux light source, such as the mercury arc vapor lamps, to the reaction volume of the gases increases the atomic concentration of oxygen in the gas flux. We believe that the optical excitation of the reaction volume of the gases selectively increases only the concentration of ozone ($O_3$) or free oxygen atoms in the reaction gas mixture and not the concentration of TEOS present. It is believed that this increase in the atomic concentration of oxygen gives rise to a more efficient reaction with less carbon incorporation in the films which in turn will leads to lower fixed charge in the films.

It is widely postulated that in CVD processes involving oxygen, carried out at higher pressures, the number of oxygen atoms available for reaction is lower than at lower pressures, due to high molecular collision frequency and increased recombination reactions. The lower pressures utilized in SACVD is one of the reasons that SACVD TEOS/$O_3$ processes are desirable for thin film deposition in semiconductor manufacture.

The key to optimizing the film's properties seemingly lies in adjusting the amount of ozone added to the process for the underlying film type and deposition temperature. The step coverage, for example, can be changed from isotropic to flow shape by increasing ozone concentration. Also, the deposition rate increases as ozone concentration increases, if the temperature is held constant. However, any increase in $O_3$ flow/concentration in the process conditions is met by lower life time of the $O_3$ molecule leading to the saturation of atomic concentration of oxygen in the reaction chamber. It is believed that the novel process of this invention makes it possible to have a functional increase in available atomic oxygen at the substrate surface, without increasing the $O_3$ concentration in the gas chamber reaction volume in atmospheric pressure CVD applications.

While the preferred embodiment uses this process for the TEOS/$O_3$ APCVD deposition of BPSG, as mentioned above other $SiO_2$ sources can be used with or without dopant sources for the $SiO_2$ film to be deposited. In broader applications of the process of this invention, the application of the high intensity light to the reaction volume could be used with any species of reaction gases in a CVD process. We believe that the process directly causes a short-term overall increase in the number of reactant species available for a CVD reaction.

It will therefore be understood that modifications and variations are possible without departing from the scope of the invention as expressed in the following claims.

We claim:

1. A chemical vapor deposition (CVD) process for depositing $SiO_2$ films on a substrate, said process comprising:
    disposing the substrate within a chemical vapor deposition reaction chamber;
    introducing a gas volume of $SiO_2$ precursors into said chamber at a chamber pressure of from 150 torr to 300 torr;
    admitting a gas volume of ozone into the chamber; and
    increasing concentration of free oxygen atoms in the volume of gases by exposing the volume of gases located within a chemically reactive distance above the substrate to a source of light without exposing the substrate surface to affect the reaction and adjusting the amount of ozone admitted such that increasing concentration of free oxygen atoms occurs without increasing ozone concentration in the volume of gases.

2. The method of claim 1 wherein the $SiO_2$ precursors are selected from the group consisting of TEOS, TMCTS (tetramethylcyclotetrasiloxane), DES (diethylsilane), DTBS (ditertiarybutylsilane), TMOS (tetramethylorthosilicate) and FTES (fluorotriethoxysilane).

3. The method of claim 2 further comprising the step of introducing a gas volume of a dopant source for the $SiO_2$.

4. The method of claim 3 wherein the dopant source for CVD deposition of the $SiO_2$ film is selected from the group consisting of triisopropylborate, TMB (trimethylborate), TEB (triethylborate), TEPo (triethylphosphate), TEPi (triethylphosphite), TMPo (trimethylphosphate), and TMPi (trimethylphosphite).

5. The method of claim 3 further comprising the step of introducing a gas volume of a carrier gas into the reaction chamber, to regulate the uniformity of film deposition on the substrate.

6. The method of claim 5 wherein the substrate is heated to a temperature within a range of 200° C. to 700° C.

7. The method of claim 6 wherein the substrate is heated to a temperature of about 480° C.

8. The method of claim 4 wherein the substrate is heated to a temperature within a range of 200° C. to 700° C.

9. The method of claim 4 wherein the substrate is heated to a temperature of about 480° C.

10. The method of claim 2 further comprising introducing a gas volume of a carrier gas into the reaction chamber, to regulate the uniformity of film deposition on the substrate.

11. The method of claim 2 wherein the substrate is heated to a temperature within a range of 200° C. to 700° C.

12. The method of claim 2 wherein the substrate is heated to a temperature of about 480° C.

13. The method of claim 1 wherein the substrate is heated to a temperature within a range of 200° C. to 700° C.

14. The method of claim 1 wherein the substrate is heated to a temperature of about 480° C.

15. A chemical vapor deposition (CVD) process using ozone, for depositing films on a substrate, said process comprising:
    disposing the substrate within a chemical vapor deposition reaction chamber and heating the substrate to a temperature of about 480° C.;
    introducing a gas volume of a preselected reaction precursor compound into said chamber;
    admitting a gas volume of ozone into the chamber to mix with the preselected reaction precursor compound and provide the reaction chamber with a pressure of from 150 torr to 300 torr; and
    increasing concentration of free oxygen atoms in the volume of gases by exposing the volume of gases located within a chemically reactive distance above the substrate to a source of light without exposing the substrate surface to affect the reaction and adjusting the amount of ozone admitted such that increasing concentration of free oxygen atoms occurs without increasing ozone concentration in the volume of gases.

16. A chemical vapor deposition (CVD) process for depositing films on a substrate, said process comprising:
    disposing the substrate within a chemical vapor deposition reaction chamber and heating the substrate to a temperature of from 200° C. to 700° C.;
    introducing a gas volume of a first preselected reaction precursor compound into said chamber to provide the reaction chamber with a pressure of from 150 torr to 300 torr;
    admitting a gas volume of at least a second preselected reaction precursor compound into said chamber; and
    increasing concentration of free oxygen atoms in the volume of gases by exposing the volume of a substantially uniform mixture of the first and second preselected reaction precursor gases located within a chemically reactive distance above the substrate to a source of light without exposing the substrate surface to affect the reaction and adjusting the amount of the second preselected reaction precursor compound admitted such that increasing concentration of free oxygen atoms occurs without increasing ozone concentration in the volume.

17. The chemical vapor deposition (CVD) process of claim 16, wherein the chemically reactive distance above the substrate extends to one mean free path length of the reaction products of the first and second preselected reaction precursor gases at the reaction pressure and temperature.

18. A chemical vapor deposition (CVD) process using ozone, for depositing films on a substrate, said process comprising the steps of:
   (a) disposing the substrate within a chemical vapor deposition reaction chamber;
   (b) introducing a gas volume of a preselected reaction precursor compound into said chamber;
   (c) admitting a gas volume of ozone into the chamber; and
   (d) increasing concentration of free oxygen atoms in the volume of gas located within a chemically reactive distance of the substrate surface by exposing to a source of light the volume of gas located within the chemically reactive distance of the substrate surface without exposing the substrate assembly to the light source to affect the reaction and adjusting the amount of ozone admitted such that increasing concentration of free oxygen atoms occurs without increasing ozone concentration in the volume.

19. A chemical vapor deposition (CVD) process for depositing films on a substrate, said process comprising the steps of:
   (a) disposing the substrate within a chemical vapor deposition reaction chamber;
   (b) introducing a gas volume of a first preselected reaction precursor compound into said chamber;
   (c) admitting a gas volume of at least a second preselected reaction precursor compound into said chamber; and
   (d) increasing concentration of free oxygen atoms in the volume of gas located within a chemically reactive distance of the substrate surface by optically exciting the volume of gas located within the chemically reactive distance of the substrate and adjusting the amount of the second preselected reaction precursor compound admitted such that increasing concentration of free oxygen atoms occurs without increasing ozone concentration in the volume.

20. A method of depositing a silicon dioxide layer on a substrate surface, the method comprising:
   contacting the substrate surface with a reaction volume of gas located above the substrate surface within a chemically reactive distance of the substrate, the reaction volume of gas comprising a $SiO_2$ precursor and ozone;
   heating the substrate surface to a temperature of at least 480° C. to about 700° C. and subjecting the reaction volume of gas to a pressure of approximately 200 to 760 torr; and
   increasing concentration of free oxygen atoms in the reaction volume of gas by illuminating the reaction volume of gas from a light source without directly exposing the substrate surface to the light source to affect the reaction and adjusting an amount of ozone added to the reaction volume such that increasing concentration of free oxygen atoms occurs without increasing ozone concentration in the reaction volume to reduce the fixed charge in the deposited films.

21. The method of claim 20, wherein the reaction volume of gas further comprises a carrier gas.

22. The method of claim 20, wherein the reaction volume of gas further comprises a carrier gas selected from the group consisting of the Noble gases, nitrogen and hydrogen.

23. The method of claim 20, wherein ozone comprises approximately 5% to 15% by volume of the reaction volume of gas.

24. The method of claim 20, wherein the reaction volume of gas has a pressure of approximately 200 torr during deposition of the silicon dioxide layer.

25. The method of claim 20, wherein the SiO2 precursor is selected from the group consisting of TEOS (tetraethylorthosilicate), TMCTS (tetramethylcyclotetrasiloxane), DES (diethylsilane), DTBS (ditertiarybutylsilane), TMOS (tetramethylorthosilicate) and FTES (fluorotriethoxysilane).

26. The method of claim 20, wherein the reaction volume of gas further comprises at least one dopant source selected from the group consisting of triisopropylborate, TMB (trimethylborate), TEB (triethylborate), TEPo (triethylphosphate), TEPi (triethylphosphite), TMPo (trimethylphosphate) and TMPi (trimethylphosphite).

27. A method of depositing a doped silicon dioxide layer on a substrate surface, the method comprising:
   contacting the substrate surface with a reaction volume of gas located above the substrate surface within a chemically reactive distance of the substrate, the reaction volume of gas comprising a $SiO_2$ precursor, ozone and at least one dopant source;
   heating the substrate surface to a temperature of at least 480° C. to about 700° C.;
   increasing concentration of free oxygen atoms in the reaction volume of gas by illuminating the reaction volume of gas from a light source without directly exposing the substrate surface to the light source to affect the reaction and adjusting an amount of ozone added to the reaction volume such that increasing concentration of free oxygen atoms occurs without increasing ozone concentration in the reaction volume to reduce the fixed charge in the deposited films; and
   subjecting the reaction volume of gas to a pressure of approximately 200 to 760 torr during deposition of the silicon dioxide layer.

28. A method of depositing a doped silicon dioxide layer on a substrate surface, comprising:
   contacting the substrate surface with a reaction volume of gas located above the substrate surface within a chemically reactive distance of the substrate, the reaction volume of gas comprising a $SiO_2$ precursor, ozone and at least two dopant sources;
   heating the substrate surface to a temperature of at least 480° C. to about 700° C.; and
   increasing concentration of free oxygen atoms in the reaction volume of gas by illuminating the reaction volume of gas from a light source without directly exposing the substrate surface to the light source to affect the reaction and adjusting an amount of ozone added to the reaction volume such that increasing concentration of free oxygen atoms occurs without increasing ozone concentration in the reaction volume.

29. The method of claim 28, wherein the reaction volume of gas has a pressure of approximately 200 to 760 torr during deposition of the silicon dioxide layer.

30. The method of claim 28, wherein the at least two dopant sources comprise a dopant source for boron and a dopant source for phosphorus.

* * * * *

UNITED STATES PATENT AND TRADEMARK OFFICE
CERTIFICATE OF CORRECTION

PATENT NO. : 7,763,327 B2
APPLICATION NO. : 11/192326
DATED : July 27, 2010
INVENTOR(S) : Gurtej S. Sandhu et al.

It is certified that error appears in the above-identified patent and that said Letters Patent is hereby corrected as shown below:

In column 8, line 10, in Claim 25, delete "SiO2" and insert -- $SiO_2$ --, therefor.

Signed and Sealed this

Twenty-eighth Day of September, 2010

David J. Kappos
*Director of the United States Patent and Trademark Office*